(12) United States Patent
Choi et al.

(10) Patent No.: US 7,940,126 B2
(45) Date of Patent: May 10, 2011

(54) SIGNAL AMPLIFICATION APPARATUS WITH ADVANCED LINEARIZATION

(75) Inventors: Young-Wan Choi, Seoul (KR); Do-Gyun Kim, Seoul (KR); Nam-Pyo Hong, Seoul (KR)

(73) Assignee: Chung-Ang University Industry-Academy Cooperation Foundation, Seoul (KR)

( * ) Notice: Subject to any disclaimer, the term of this patent is extended or adjusted under 35 U.S.C. 154(b) by 0 days.

(21) Appl. No.: 12/625,201

(22) Filed: Nov. 24, 2009

(65) Prior Publication Data

US 2011/0018636 A1    Jan. 27, 2011

(30) Foreign Application Priority Data

Jul. 21, 2009    (KR) ........................ 10-2009-0066467

(51) Int. Cl.
*H03F 3/04* (2006.01)

(52) U.S. Cl. ....................................... 330/311; 330/310

(58) Field of Classification Search .................. 330/311, 330/310

See application file for complete search history.

(56) References Cited

U.S. PATENT DOCUMENTS

| 6,498,533 | B1 * | 12/2002 | Sowlati | 330/98 |
| 6,965,270 | B1 * | 11/2005 | Ross | 330/311 |
| 7,551,036 | B2 * | 6/2009 | Berroth et al. | 330/311 |

* cited by examiner

*Primary Examiner* — Henry K Choe

(74) *Attorney, Agent, or Firm* — Ladas & Parry LLP

(57) ABSTRACT

Provided is a signal amplification apparatus with advanced linearization, the signal amplification apparatus including: a driving unit having a structure of a cascode amplifier including a first active element and a second active element and outputting an amplification signal in which an input signal is amplified, to an output terminal; a third active element receiving a signal diverged between the first active element and the second active element while gate and drain terminals of the third active element are shorted; a fourth active element of which gate and drain terminals are connected to a source terminal of the third active element; and a fifth active element of which gate terminal is connected to the drain terminal of the fourth active element, outputting a non-linear signal having an opposite phase to the amplification signal to the output terminal so as to cancel a third-order inter-modulation distortion component included in the input signal. An amplification signal in which an input signal is amplified is combined with a non-linear signal having an opposite phase to the amplification signal and a low gain and is output so that a third-order inter-modulation distortion component included in the input signal can be cancelled and a signal with advanced linearity can be output.

5 Claims, 8 Drawing Sheets

SIGNAL AMPLIFICATION APPARATUS WITH ADVANCED LINEARIZATION

CROSS-REFERENCE TO RELATED PATENT APPLICATION

This application claims the benefit of Korean Patent Application No. 10-2009-0066467, filed on Jul. 21, 2009, in the Korean Intellectual Property Office, the disclosure of which is incorporated herein in its entirety by reference.

BACKGROUND OF THE INVENTION

1. Field of the Invention

The present invention relates to a signal amplification apparatus with advanced linearization, and more particularly, to an apparatus for removing distortion signals generated due to non-linearization of an active element when an input signal is amplified and output.

2. Description of the Related Art

In general, mobile communication systems require an apparatus for transmitting and receiving signals. When signals are transmitted from a transmission terminal to a receiving terminal, a loss occurs due to characteristics of a channel according to a transmission distance. Thus, in order to compensate for the loss, mobile communication systems require a signal amplifier.

FIG. 1 is a circuit diagram of a conventional signal amplifier. Referring to FIG. 1, the conventional signal amplifier is a common source amplifier and includes a driving unit 110 that amplifies an input signal and a resistor 120 that is a passive element. The driving unit 110 is an active element and is a three-terminal transistor including a source, a drain, and a gate. A current that flows between the drain and the source is varied by a radio frequency (RF) signal that is input to the gate. Also, the resistor 120 that is the passive element performs the function of determining a gain of the signal amplifier and an operating point of the driving unit 110.

FIG. 2 is a circuit diagram of a conventional cascode amplifier including a common source transistor and a common gate transistor. Referring to FIG. 2, the conventional cascode amplifier includes a driving unit 210 that includes a common source and a common gate in order to enhance the degree of separation of input and output, and a load terminal 220. Also, an inductor for obtaining a high gain from a high-frequency amplifier is used in the load terminal 220.

A heterodyne method that is widely used in communication systems uses an intermediate frequency so as to enhance the degree of frequency selection at a receiving side. The heterodyne method has a limitation in realizing a low cost, low power, and small RF front end. In a direct conversion method that has been suggested to solve the problems, an intermediate frequency terminal is removed to simplify processing of an RF signal. In the direct conversion method, an analog block of the communication system is minimized to realize a low cost, low power, and small mobile communication terminal. However, in the direct conversion method, inter-modulation distortion occurs due to non-linearity that occurs in each circuit.

In inter-modulation distortion, undesired frequency components are generated due to non-linear components that are generated by the active element. Thus, a transceiver for transmitting and receiving RF signals, when the gain of an input signal is high, non-linear components are relatively increased, and distortion of a transmitted signal occurs, and a problem occurs in data transmission. In digital mobile communication such as code division multiple access (CDMA), each of signals is not used in different frequency domains, and signals each having a wide frequency band are encrypted as codes and coexist in the same frequency band, and thus linearity of signals is an important factor.

A back-off method in which a laser diode having a better performance than a performance to be used is used, a feed-forward method in which only distortion components of a laser diode are extracted to generate signals having the same magnitude as that of distortion signals of a main signal and having an opposite phase to that of the distortion signals and to remove only the distortion signals, and a pre-distortion method in which signals having the same magnitude of that of distortion signals of a main signal and having an opposite phase to that of the distortion signals are generated to remove the distortion signals, have been suggested as conventional signal linearization methods. In these signal linearization methods, many RF elements are used to cause a high cost and high power consumption and the volume of a circuit is increased.

Meanwhile, in the conventional cascode amplifier of FIG. 2, a second-order derivative $g_m''$ that is generated in Equation of a drain current $I_{DS}$ is minimized to remove non-linear components. However, the signal linearization method can be used only in a narrow bandwidth and is not appropriate for compensating for linearity of large signals output from a transmission unit.

SUMMARY OF THE INVENTION

The present invention provides a signal amplification apparatus in which a third-order inter-modulation distortion component included in an input signal is removed when the input signal is amplified so that a signal with advanced linearity can be output.

According to an aspect of the present invention, there is provided a signal amplification apparatus including: a driving unit having a structure of a cascode amplifier including a first active element and a second active element and outputting an amplification signal in which an input signal is amplified, to an output terminal; a third active element receiving a signal diverged between the first active element and the second active element while gate and drain terminals of the third active element are shorted; a fourth active element of which gate and drain terminals are connected to a source terminal of the third active element; and a fifth active element of which gate terminal is connected to the drain terminal of the fourth active element, outputting a non-linear signal having an opposite phase to the amplification signal to the output terminal so as to cancel a third-order inter-modulation distortion component included in the input signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 3:
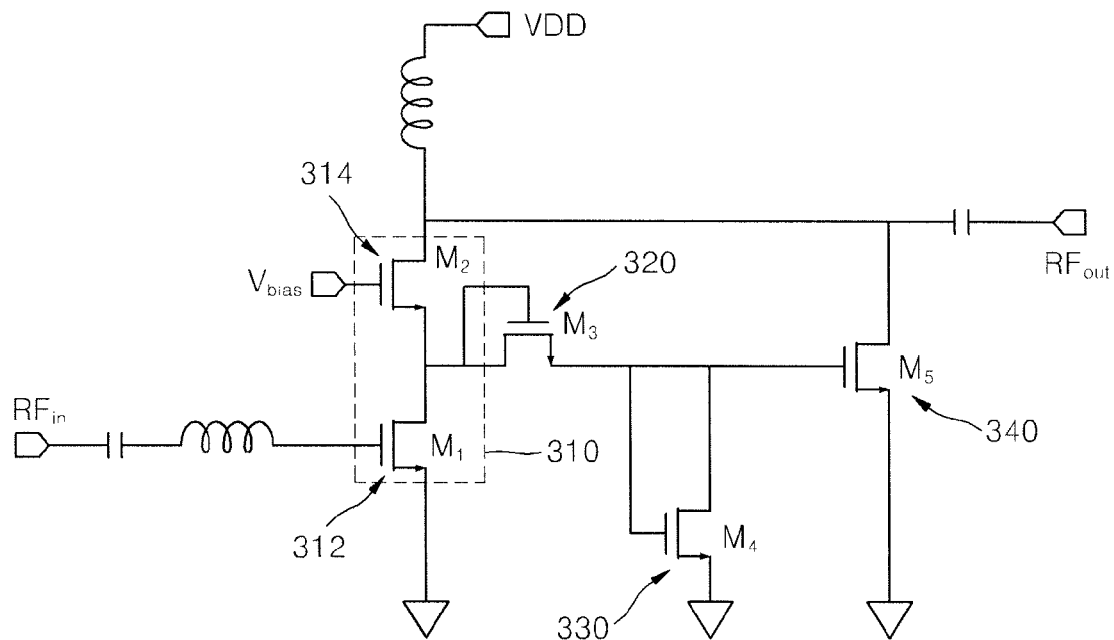
FIG. 3 is a circuit diagram of a signal amplification apparatus with advanced linearization according to an embodiment of the present invention.

FIG. 3 is a circuit diagram of a signal amplification apparatus with advanced linearization according to an embodiment of the present invention. Referring to FIG. 3, the signal amplification apparatus with advanced linearization according to the present embodiment includes a plurality of active elements, i.e., a driving unit 310 including a first active element 312 and a second active element 314, a third active element 320, a fourth active element 330, and a fifth active element 340.

In the signal amplification apparatus of FIG. 3, the active elements, the first active element 312 through the fifth active element 340, are MOSFETs. However, these MOSFETs as active elements can be replaced by other three-terminal semiconductor devices that are commonly used.

Figure 1:
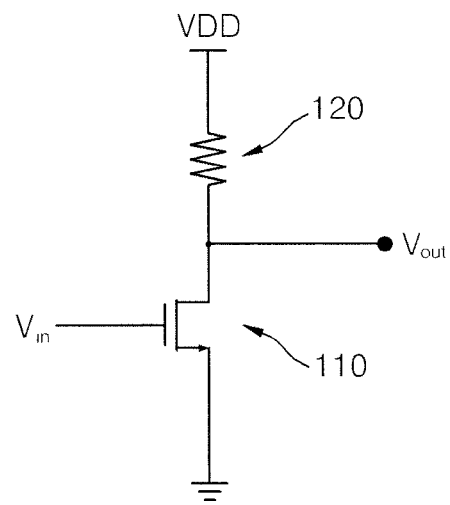
FIG. 1 is a circuit diagram of a conventional signal amplifier.
Figure 2:
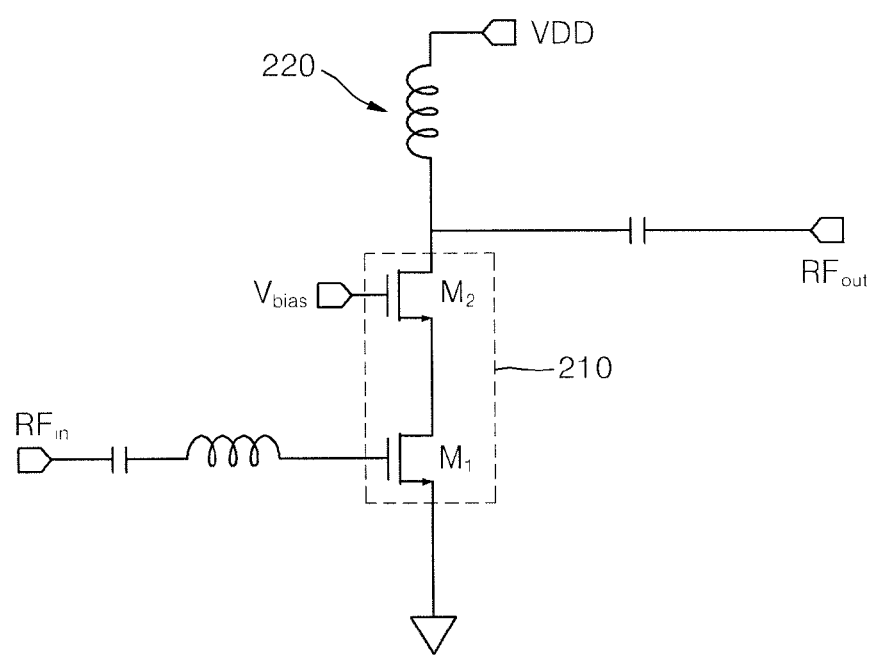
FIG. 2 is a circuit diagram of a conventional cascode amplifier including a common source transistor and a common gate transistor.

The driving unit 310 has the same configuration as the cascode amplifier of FIG. 2 and performs a function of amplifying an input signal and outputting the amplified signal to an output terminal of the signal amplification apparatus of FIG. 3. The first active element 312 of the driving unit 310 has a common source structure in which the magnitude of a current between drain and source terminals is varied based on the magnitude of a voltage between gate and source terminals and an input signal $RF_{in}$ is input to the gate terminal. Next, the second active element 314 has a common gate structure in which a gate terminal is connected to a bias electric potential $V_{bias}$, a source terminal is connected to the drain terminal of the first active element 312 and a drain terminal is connected to the output terminal of the signal amplification apparatus of FIG. 3.

The third active element 320 of which gate and drain terminals are connected to the source terminal of the second active element 314 receives a signal output between the first active element 312 and the second active element 314 and sets a direct current (DC) operating point of the fifth active element 340. Also, the fourth active element 330 receives a signal output from the third active element 320 and reduces a gain of the fifth active element 340. The fifth active element 340 has a common source structure in which a gate terminal is connected to gate and drain terminals of the fourth active element 330 and a drain terminal is connected to the output terminal of the signal amplification apparatus of FIG. 3, and removes a non-linear component of a signal.

In FIG. 3, the third active element 320 operates like a diode while the drain and gate terminals of the third active element 320 are shorted, and a DC voltage between the first active element 312 and the second active element 314 is decreased by the third active element 320 to a threshold voltage of a transistor. As described above, the fourth active element 330 also performs a function of a bias transistor for determining the DC operating point of the fifth active element 340. Thus, the fifth active element 340 has a low gate voltage, and the DC operating point of the fifth active element 340 is determined near the threshold voltage of the transistor. Due to the above phenomenon, the fifth active element 340 has a low gain and generates a signal with high non-linearity.

When it is assumed that the phase of the input signal is 0° and the input signal passes through the first active element 312, the phase of the input signal is 180°-inverted and is amplified. The amplified signal output from the first active element 312 passes through the second active element 314 that is a common gate amplifier having a current gain. Thus, an amplification signal output from the driving unit 310 has a 180°-inverted phase with respect to the input signal. Meanwhile, a signal diverged at an intermediate terminal of the first active element 312 and the second active element 314 passes through the third active element 320 and then the phase of the signal is 180°-inverted by the fifth active element 340. Thus, the signal from the fifth active element 340 has the same phase as that of the initial input signal.

The input signal that is input to the first active element 312 of the driving unit 310 is transmitted via two paths. In detail, the input signal that passes through a first path, i.e., the first active element 312 and the second active element 314, has a high gain and a 180°-inverted phase with respect to the initial input signal. Also, the input signal that passes through a second path, i.e., the first active element 312, the third active element 320, the fourth active element 330, and the fifth active element 340, has a low gain and high non-linearity and has the same phase as that of the initial input signal.

Since the signals transmitted via the two paths are finally combined with each other at the output terminal of the signal amplification apparatus of FIG. 3, an inter-modulation distortion signal that exists in the input signal may be cancelled due to the two signals having a phase difference of 180°.

Figure 4:
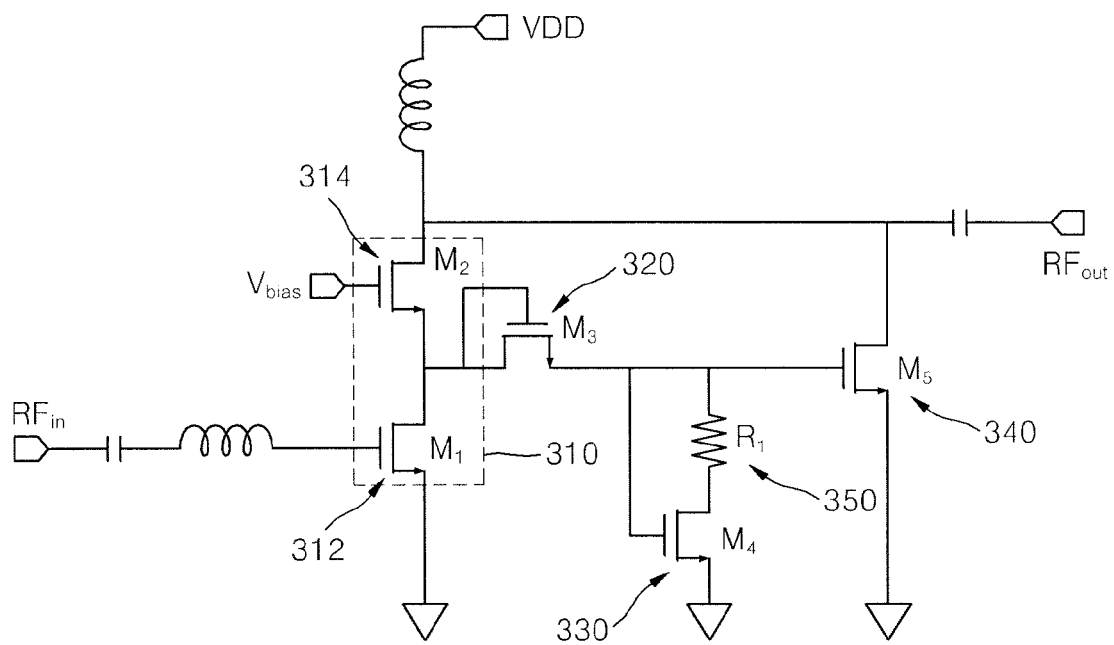
FIG. 4 is a circuit diagram of a signal amplification apparatus with advanced linearization according to another embodiment of the present invention.

FIG. 4 is a circuit diagram of a signal amplification apparatus with advanced linearization according to another embodiment of the present invention. The signal amplification apparatus of FIG. 4 is different from the signal amplification apparatus of FIG. 3 in that it further includes a first resistor element 350 that is a passive element connected between a drain terminal of the fourth active element 330 and a gate terminal of the fifth active element 340 to enhance linearization of an input signal.

Figure 5:
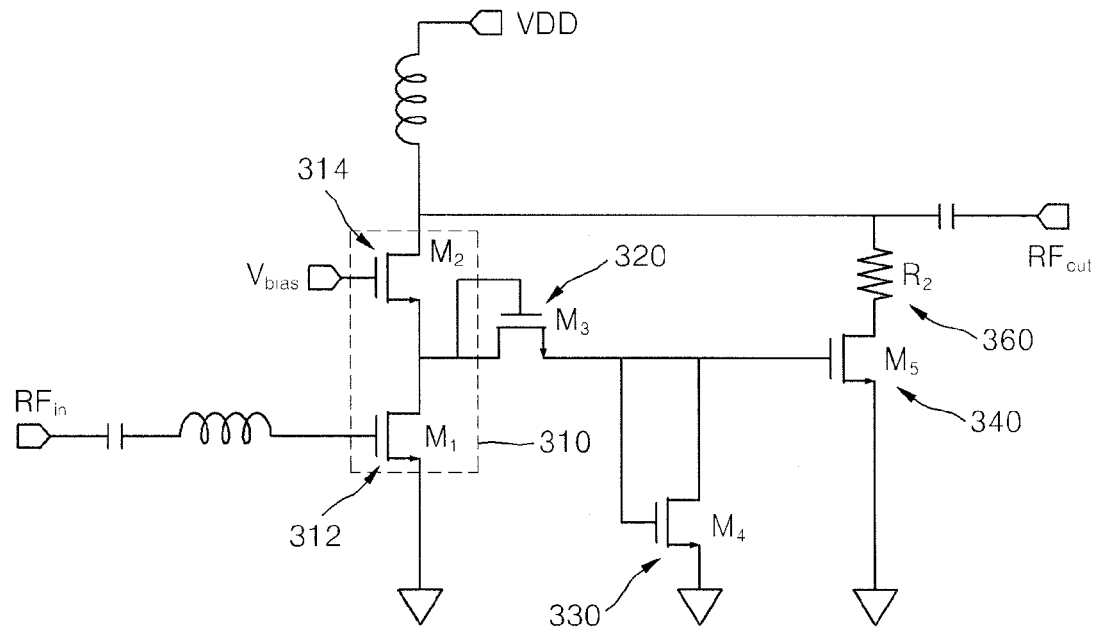
FIG. 5 is a circuit diagram of a signal amplification apparatus with advanced linearization according to another embodiment of the present invention.

FIG. 5 is a circuit diagram of a signal amplification apparatus with advanced linearization according to another embodiment of the present invention. The signal amplification apparatus of FIG. 5 is different from the signal amplification apparatus of FIG. 3 in that it further includes a second resistor element 360 that is a passive element connected between a drain terminal of the fifth active element 340 and an output terminal to enhance linearization of an input signal.

Figure 6:
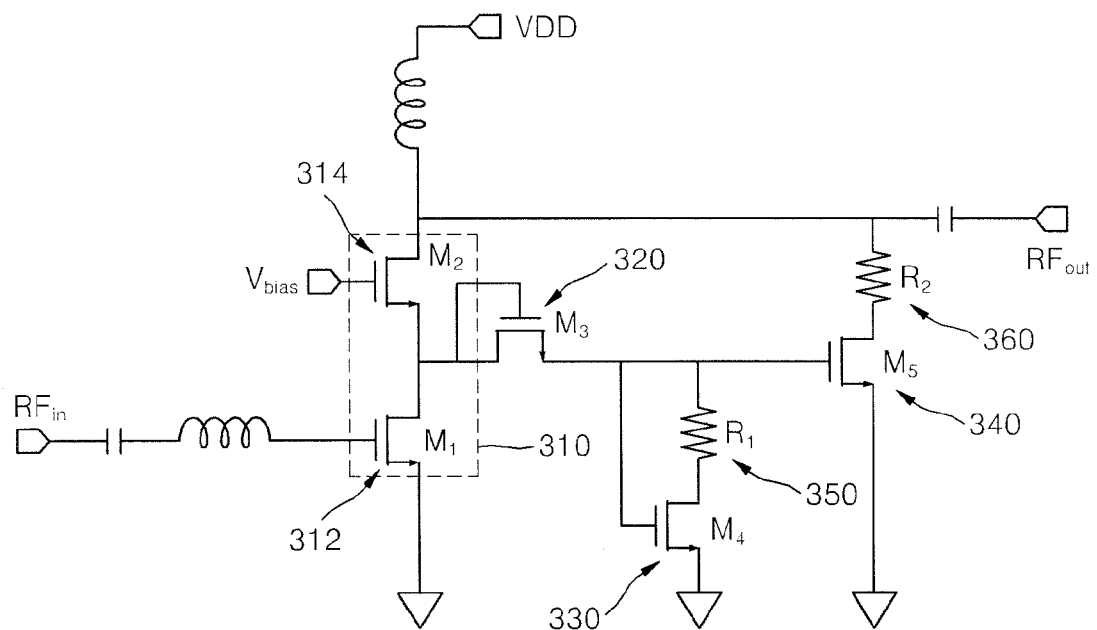
FIG. 6 is a circuit diagram of a signal amplification apparatus with advanced linearization according to another embodiment of the present invention.

FIG. 6 is a circuit diagram of a signal amplification apparatus with advanced linearization according to another embodiment of the present invention. The signal amplification apparatus of FIG. 6 is different from the signal amplification apparatus of FIG. 3 in that it further includes a first resistor element 350 and a second resistor element 360.

The first resistor element 350 and the second resistor element 360 that are added passive elements adjust the magnitude of an output signal of the driving unit 310, i.e., an amplification signal, and the magnitude of the fifth active element 340, i.e., a non-linear signal, to be the same so as to remove a non-linear component from the output terminal. Furthermore, as described above, the operating point of the fifth active element 340 is determined by the third active element 320 and the fourth active element 330, and thus, an additional bias circuit for driving the fifth active element 340 is not required.

The first active element 312 through fifth active element 340 of the signal amplification apparatuses with advanced linearization of FIGS. 3 through 6 may be implemented by an n-channel MOSFET (NMOS). Also, a capacitor and an inductor that are connected to the gate terminal of the first active element 312 to which the input signal is input are used to remove a DC component from the input signal and to match the input signal, and the inductor connected to the output terminal of the driving unit 310 serves as an RF choke. The capacitor connected to the output terminal of the driving unit 310 is used to remove a DC component from the output signal.

Hereinafter, a principle of cancelling and removing a non-linear component included in an input signal by using one of the signal amplification apparatuses of FIGS. 3 through 6 will be described.

Non-linearity of a general common source transistor occurs due to non-linearity of transconductance $g_m$ that is a variation of a drain current due to a change in voltage input to a gate. The variation of the drain current according to a gate input voltage may be expressed by Equation 1:

$$i_{DS} = I_{DC} + g_{m1} \cdot v_{gs} + g_{m2} \cdot v_{gs}^2 + g_{m3} \cdot v_{gs}^3 + \ldots \quad (1),$$

where $i_{DS}$ is a drain current, and $I_{DC}$ is a DC current, and $g_{mn}$ is an n-order differential coefficient of a DC transition function, and $V_{gs}$ is a gate input voltage.

Also, $g_{m1}$ through $g_{m3}$ of Equation 1 may be defined by Equation 2:

$$g_{m1} = \frac{\partial I_{DS}}{\partial V_{GS}}, \; g_{m2} = \frac{\partial^2 I_{DS}}{\partial V_{GS}^2}, \; g_{m3} = \frac{\partial^3 I_{DS}}{\partial V_{GS}^3} \quad (2)$$

In Equations 1 and 2, $g_{m3}$ is a coefficient of a third-order component of a gate-source voltage, and thus is a main component of third-order inter-modulation distortion $IMD_3$ of a common source amplifier.

The cascode amplifier of FIG. 2 is constituted by connecting a common source terminal and a common gate terminal. A non-linear component that is generated in the common source terminal is transmitted to the common gate terminal that operates as a current buffer. Thus, the non-linear component generated in the common source terminal is a main factor for deteriorating linearity of the cascode amplifier of FIG. 2. Thus, the signal amplification apparatuses of FIGS. 3 through 6 include the fourth active element 330 so as to remove the non-linear component. Hereinafter, a principle of cancelling a non-linear signal included in the output signal of the driving unit 310 by using the fourth active element 330 will be described.

Figure 7:
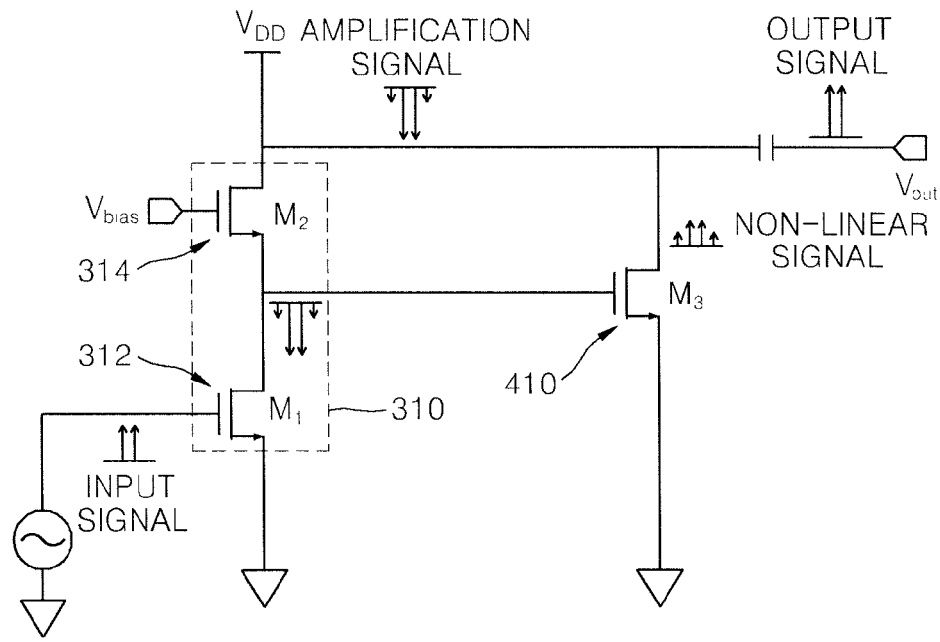
FIG. 7 is a circuit diagram illustrating a case where an inter-modulation distortion canceller that is a non-linear signal generator is connected to a driving unit including a first active element and a second active element, i.e., the conventional cascode amplifier of FIG. 2.

FIG. 7 is a circuit diagram illustrating a case where an inter-modulation distortion canceller 410 that is a non-linear signal generator that is the same as the fifth active element 340 is connected to the driving unit 310 including the first active element 312 and the second active element 314, i.e., the conventional cascode amplifier of FIG. 2. Referring to FIG. 7, an input signal is amplified by the first active element 312 and the second active element 314 of the driving unit 310, and the amplified signal and the input signal have a phase difference of 180°. Also, a signal diverged at the intermediate terminal of the first active element 312 and the second active element 314 is input to the inter-modulation distortion canceller 410.

The inter-modulation distortion canceller 410 is designed to operate near a threshold voltage and allows the gain of a fundamental signal to be minimized and a third-order inter-modulation component to be maximized. The signal that passes through the inter-modulation distortion canceller 410 has a phase difference of 180° with respect to the output signal of the driving unit 310, i.e., the amplification signal.

A final output signal is a signal that is generated by combining the output signal of the driving unit 310, i.e., the amplification signal, and the output signal of the inter-modulation distortion canceller 410, i.e., the non-linear signal. If the sizes of third-order inter-modulation components of two signals are the same, the third-order inter-modulation component of the input signal may be cancelled from the final output signal. In this case, the size of the fundamental signal is greatly amplified by the driving unit 310. Thus, even when the fundamental signal is combined with the non-linear signal output from the inter-modulation distortion canceller 410, the size of the fundamental signal is not varied.

If a gain of the first active element 312 and a gain of the second active element 314 are $-G_{M1}$ and $-G_{M2}$, respectively, outputs of the first active element 312, the second active element 314, and the inter-modulation distortion canceller 410 may be expressed by Equation 3. In this case, symbol '-' of the gain of the first active element 312 and the gain of the second active element 314 represents that a phase difference between an input signal and an output signal is 180°.

$$Out_{M1} = -\left(G_{M1} \cdot v_{in} + \left(\frac{1}{2!}\right) \cdot G_{M12} \cdot v_{in}^2 + \left(\frac{1}{3!}\right) \cdot G_{M13} \cdot v_{in}^3\right) \quad (3)$$

-continued $$Out_{M2} = G_{M21} \cdot Out_{M1} + \left(\frac{1}{2!}\right) \cdot G_{M22} \cdot Out_{M1}^2 + \left(\frac{1}{3!}\right) \cdot G_{M23} \cdot Out_{M1}^3$$

$$Out_{M3} = -\left(G_{M31} \cdot Out_{M1} + \left(\frac{1}{2!}\right) \cdot G_{M32} \cdot Out_{M1}^2 + \left(\frac{1}{3!}\right) \cdot G_{M33} \cdot Out_{M1}^3\right),$$

where $Out_{M1}$ is an output signal of the first active element 312, and $Out_{M2}$ is an output signal of the second active element 314, and $Out_{M3}$ is an output signal of the inter-modulation distortion canceller 410, and $G_{m1n}$ is an n-order gain coefficient, and $v_{in}$ is a gate-source voltage signal input to the first active element 312.

The coefficient of $v_{in}^3$ obtained from Equation 3 may be expressed by Equation 4 and has to be 0 so as to remove inter-modulation distortion components.

$$G_{M11}^3 \cdot (G_{M33} - G_{M23}) + G_{M13} \cdot (G_{M31} - G_{M21}) - 3 \cdot G_{M11} \cdot G_{M12} \cdot (G_{M33} - G_{M22}) = 0 \quad (4)$$

In order to make the coefficient of $v_{in}^3$ of Equation 4 be 0, a gain coefficient corresponding to the second active element 314 and a gain coefficient corresponding to the inter-modulation distortion canceller 410 have to be the same. Thus, by varying the channel width of the inter-modulation distortion canceller 410, a third-order inter-modulation component may be cancelled.

Figure 8:
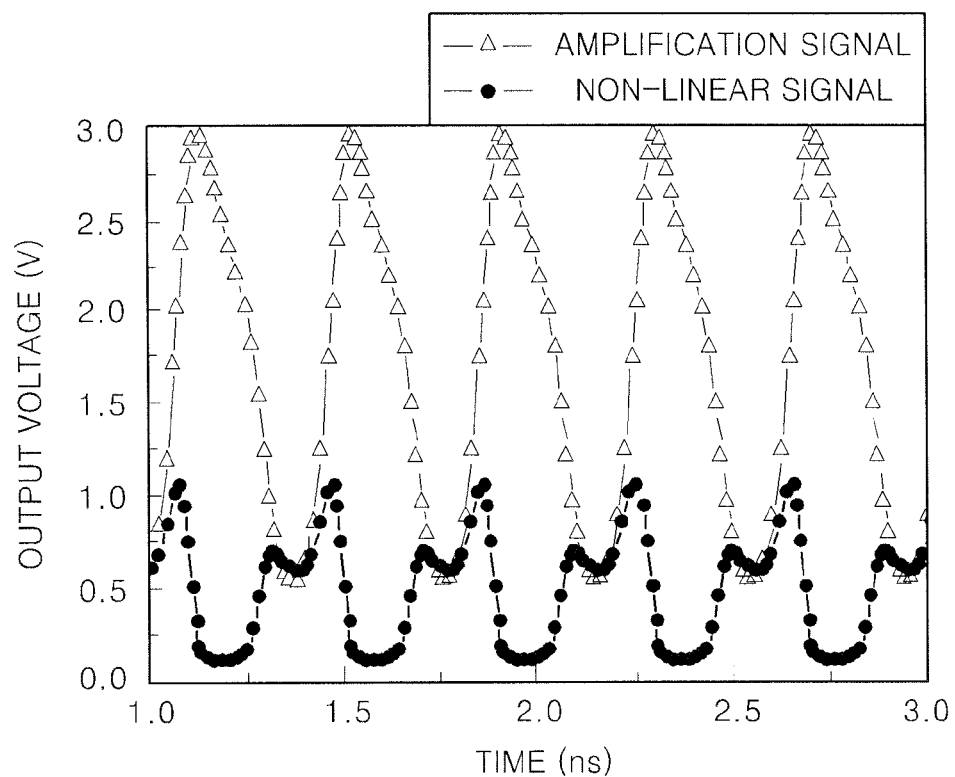
FIG. 8 is a graph showing the result of comparing an output waveform of the driving unit with an output waveform of the inter-modulation distortion canceller in the circuit of FIG. 7.

FIG. 8 is a graph showing the result of comparing an output waveform of the driving unit 310 with an output waveform of the inter-modulation distortion canceller 410 in the circuit of FIG. 7. Waveforms shown in FIG. 8 represent the result of simulation in which an input signal of 2500 MHz is applied to the driving unit 310 and then voltage signals output from the driving unit 310 and the inter-modulation distortion canceller 410 are measured in a time domain. Referring to FIG. 8, the output signal of the driving unit 310, i.e., an amplification signal has a phase difference of 180° with respect to the output signal of the inter-modulation distortion canceller 410, i.e., a non-linear signal.

Figure 9:
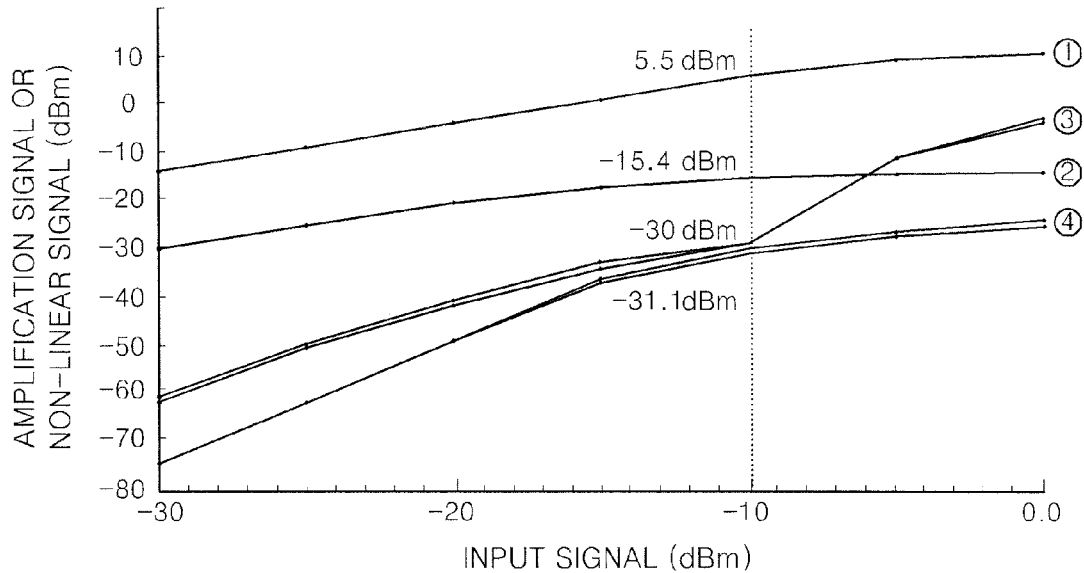
FIG. 9 is a graph showing the magnitude of an amplification signal or a non-linear signal according to the magnitude of an input signal in the signal amplification apparatus of FIG. 6.

FIG. 9 is a graph showing the magnitude of an amplification signal or a non-linear signal according to the magnitude of an input signal in the signal amplification apparatus of FIG. 6. In FIG. 9, magnitudes of the input signal and the amplification signal are indicated by dBm. Graph of ① represents a first-order component of the amplification signal that passes through the first active element 312 and the second active element 314 and is output, and graph of ③ represents a third-order inter-modulation component of the amplification signal. Also, graph of ② represents a first-order component of the non-linear signal that passes through the first active element 312, the third active element 320, and the fifth active element 340, and graph of ④ represents a third-order inter-modulation component of the non-linear signal.

Referring to FIG. 9, graphs of ③ and ④ that represent the third-order inter-modulation component of the amplification signal that passes through one path and the third-order inter-modulation component of the non-linear signal that passes through another path have a phase difference of 180° and the same output magnitude each other. Thus, a signal according to graph of ③ and a signal according to graph of ④ may be finally cancelled from the output terminal. Thus, linearization of the input signal may be enhanced compared to the conventional cascode amplifier of FIG. 2.

Figure 10:
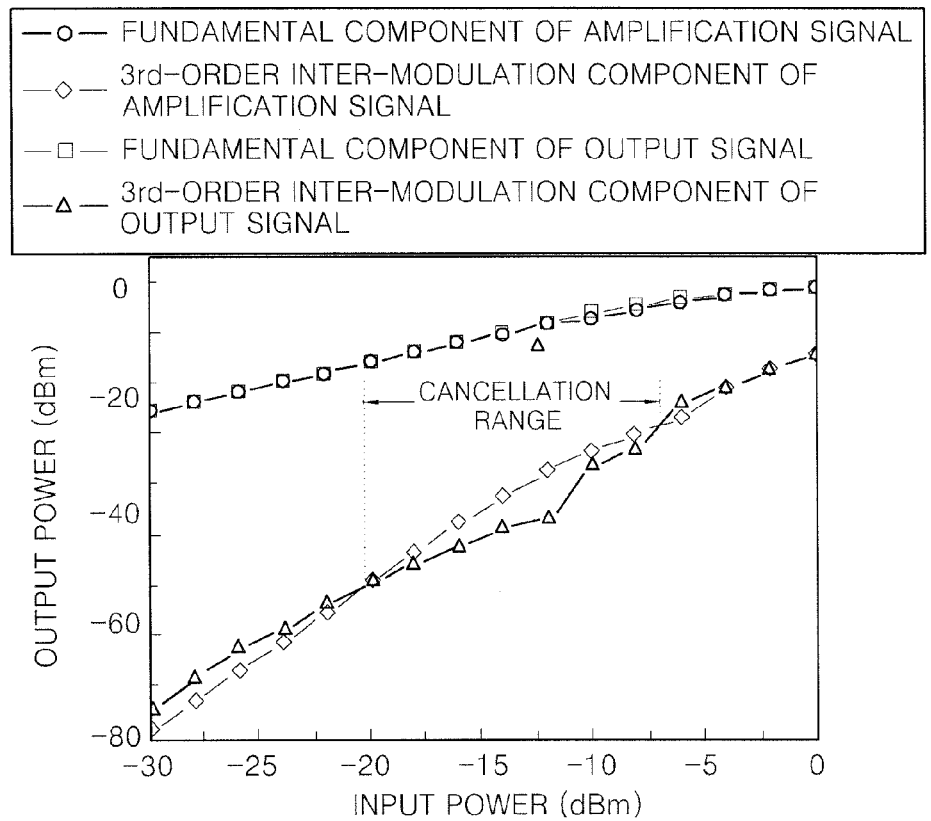
FIG. 10 is a graph showing the result of two-tone simulation with respect to the signal amplification apparatus of FIG. 6.

FIG. 10 is a graph showing the result of two-tone simulation with respect to the signal amplification apparatus of FIG. 6. In two-tone simulation, input frequencies are 2490 MHz and 2510 MHz, and input power is between −30 dBm and 0 dBm. Referring to FIG. 10, in a section where input power is between −20 dBm and −7 dBM, the size of a third-order inter-modulation component included in the output signal of the signal amplification apparatus of FIG. 6 including the inter-modulation distortion canceller 410 of FIG. 7 is smaller than the size of a third-order inter-modulation component included in the output signal of the driving unit 310. In particular, when input power is −12 dBm, third-order inter-modulation power is decreased to 10 dB or higher.

Experiments for checking linearization of a signal by using the signal amplification apparatus of FIG. 6 were conducted.

Figure 11:
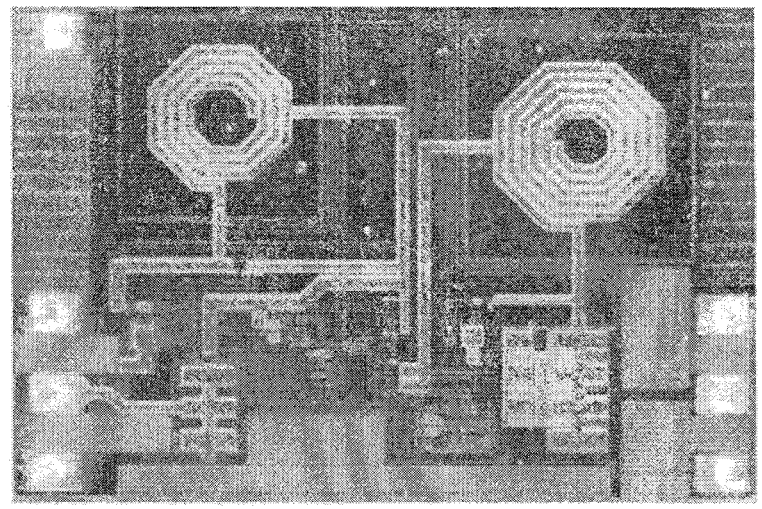
FIG. 11 is a micro-photo of a drive amplifier in which the signal amplification apparatus of FIG. 6 is implemented.

FIG. 11 is a micro-photo of a drive amplifier in which the signal amplification apparatus of FIG. 6 is implemented. The drive amplifier of FIG. 11 in which the inter-modulation distortion canceller 410 is used has the same configuration as the signal amplification apparatus of FIG. 6 and was fabricated by a 0.18 μm CMOS process. A bias current of the conventional cascode amplifier of FIG. 2 and a bias current of the drive amplifier of FIG. 11 in which the inter-modulation distortion canceller 410 is used were 11 mA and 13 mA, respectively, and in the drive amplifier using the inter-modulation distortion canceller 410, a further current of 2 mA was consumed. This is because a current flows through the inter-modulation distortion canceller 410. Also, the gain of the cascode amplifier of FIG. 2 and the gain of the drive amplifier using the inter-modulation distortion canceller 410 were measured as 11.8 dB and 11.5 dB at a frequency band of 2500 MHz, and a reduction in gain of the inter-modulation distortion canceller 410 was ignorable. This is because the magnitude of the input signal is amplified by the driving unit 310, as described above. A reflection coefficient $S_{22}$ of an output terminal of the cascode drive amplifier of FIG. 2 and a reflection coefficient $S_{22}$ of an output terminal of the drive amplifier of FIG. 11 were measured as −14.7 dB and −14.5 dB respectively. In the experiments, the gain and the reflection coefficient $S_{22}$ were measured by a vector network analyzer.

Figure 12:
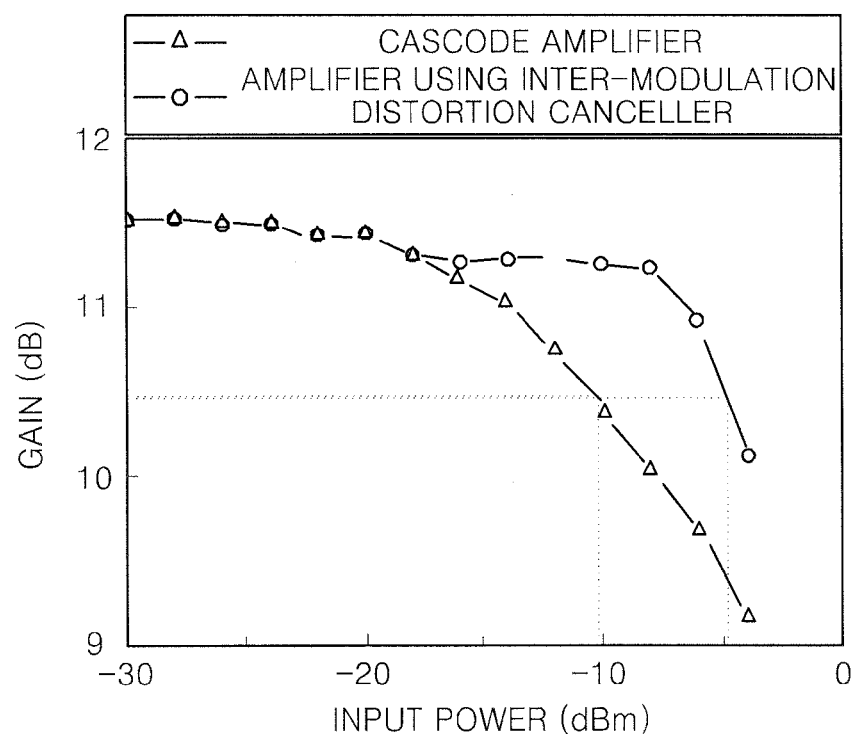
FIG. 12 is a graph showing the result of measuring $OP_{1dB}$ of the conventional cascode drive amplifier of FIG. 2 and $OP_{1dB}$ of a drive amplifier using an inter-modulation distortion canceller according to an embodiment of the present invention.

FIG. 12 is a graph showing the result of measuring $OP_{1dB}$ of the conventional cascode amplifier of FIG. 2 and $OP_{1dB}$ of a drive amplifier using the inter-modulation distortion canceller 410. $OP_{1dB}$ was measured at 2500 MHz. Referring to FIG. 12, $OP_{1dB}$ of the drive amplifier using the inter-modulation distortion canceller 410 was measured as 5.5 dBm and was enhanced by 5 dBm compared to 0.5 dBm that is $OP_{1dB}$ of the conventional cascode amplifier of FIG. 2.

Figure 13:
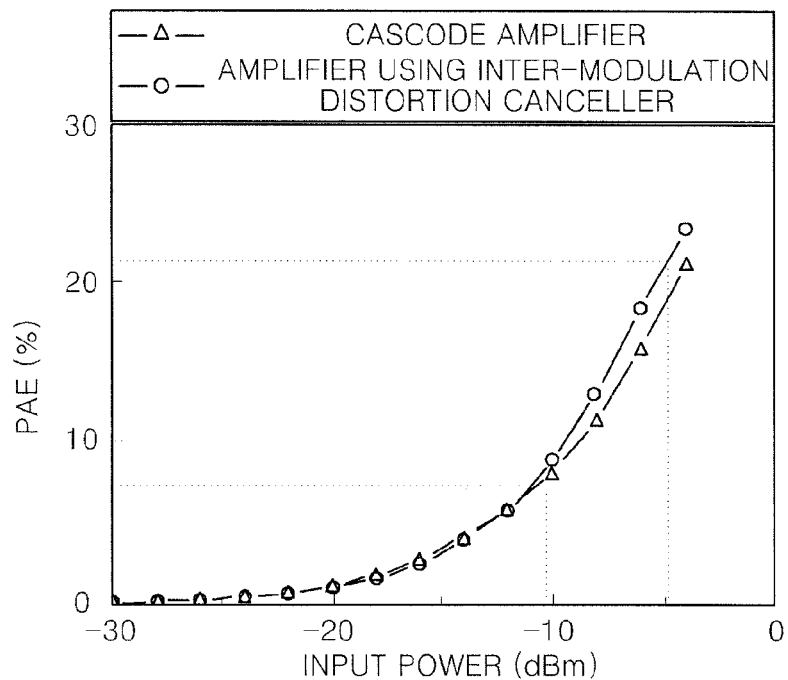
FIG. 13 is a graph showing power-added efficiency (PAE) versus input power.

FIG. 13 is a graph showing power-added efficiency (PAE) versus input power. PAE is defined by Equation 5:

$$PAE = \frac{P_{out} - P_{in}}{P_{DC}}, \quad (5)$$

where $P_{out}$ is output power, and $P_{in}$ is input power, and $P_{DC}$ is DC power.

In other words, graph of FIG. 13 represents values that are obtained by dividing a difference between input and output power of the amplifier by DC power when input power is increased. This is an indicator indicative of effect on which DC consumption power affects the gain of an RF signal and is power efficiency of the drive amplifier. Thus, as PAE is increased, the efficiency of the drive amplifier is increased. Referring to FIG. 13, PAE of the cascode amplifier of FIG. 2 and PAE of the drive amplifier using the inter-modulation distortion canceller 410 according to a variation of input power were measured to be nearly similar. However, when calculating PAE at $OP_{1dB}$ that is maximum saturation power of the amplifier, PAE of the drive amplifier using the inter-modulation distortion canceller 410 was 21% and thus was enhanced by 13.5% compared to the conventional cascode amplifier of FIG. 2. Thus, the drive amplifier using the inter-modulation distortion canceller 410 enhances $OP_{1dB}$ and also enhances PAE remarkably.

Figure 14:
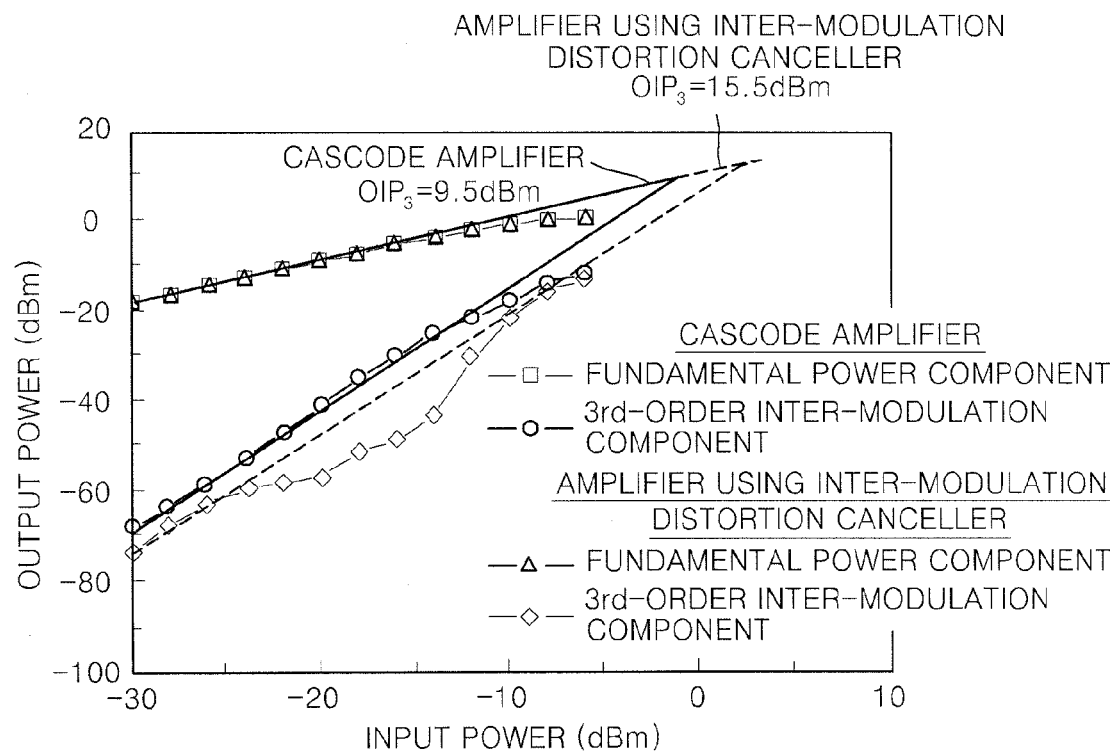
FIG. 14 is a graph showing output power versus input power of the conventional cascode drive amplifier of FIG. 2 and output power versus input power of the drive amplifier using the inter-modulation distortion canceller according to an embodiment of the present invention.
Figure 15:
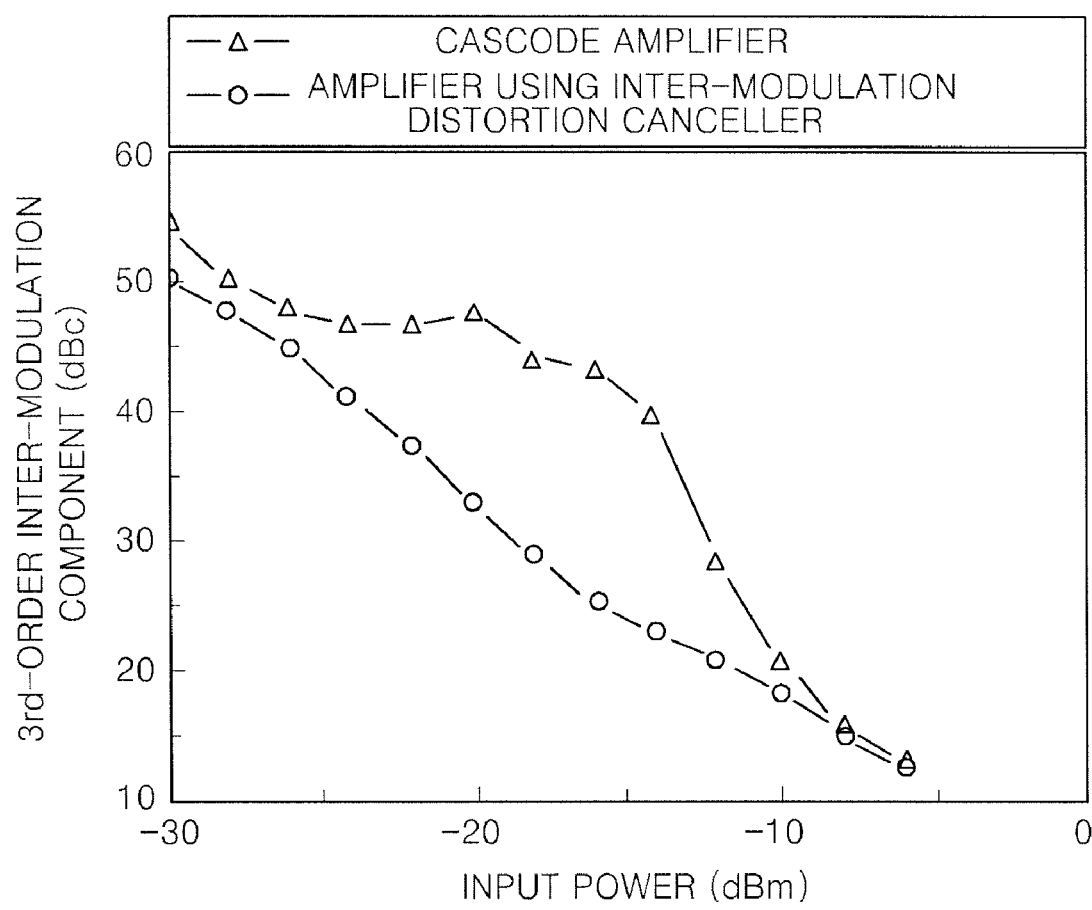
FIG. 15 is a graph showing a third-order inter-modulation distortion component versus input power of the conventional cascode drive amplifier of FIG. 2 and a third-order inter-modulation distortion component versus input power of the driver amplifier using the inter-modulation distortion canceller according to an embodiment of the present invention.

FIG. 14 is a graph showing output power versus input power of the conventional cascode amplifier of FIG. 2 and output power versus input power of the drive amplifier using the inter-modulation distortion canceller 410, and FIG. 15 is a graph showing a third-order inter-modulation distortion component versus input power of the conventional cascode amplifier and a third-order inter-modulation distortion component versus input power of the driver amplifier using the inter-modulation distortion canceller. Graphs of FIGS. 14 and 15 are obtained as the result of two-tone simulation. Also, two-tone input frequencies are 2490 MHz and 2510 MHz that have a frequency interval of 20 MHz.

From graph of FIG. 14, with respect to $OIP_3$ that is an indicator indicative of linearity of an amplifier, $OIP_3$ of the drive amplifier using the inter-modulation distortion canceller 410 was measured as 15.5 dBm and was enhanced by 6 dB compared to the cascode amplifier of FIG. 2. In this case, the result of measuring $OIP_3$ was obtained when input power was −30 dBm. Also, referring to FIG. 15, when the inter-modulation distortion canceller 410 was used, a third-order inter-modulation distortion component was increased by 15 dB when input power was −20 dBm. The phenomenon in which the third-order inter-modulation distortion component was rapidly increased occurred until input power was −14 dBm.

The result of experiments conducted on the cascode amplifier of FIG. 2 and the drive amplifier using the inter-modulation distortion canceller 410 was shown in Table 1.

TABLE 1

| Parameter | Cascode drive amplifier | Drive amplifier using inter-modulation distortion canceller 410 |
|---|---|---|
| Supply voltage | 1.8 V | 1.8 V |
| Supply current | 11 mA | 13 mA |
| Power gain | 11.8 dB | 11.5 dB |
| $S_{22}$ | −14.7 dB | −14.5 dB |
| $OP_{1\,dB}$ | 0.5 dBm | 5.5 dBm |
| $OIP_3$ | 9.5 dBm | 15.5 dBm |
| PAE (at $OP_{1\,dB}$) | 7.5% | 21% |

As described above, when an amplifier is designed using the inter-modulation distortion canceller 410, $OP_{1dB}$ and $OIP_3$ are greatly increased so that linearity of the drive amplifier may be remarkably enhanced. Also, third-order inter-modulation distortion characteristics are rapidly enhanced in a section of particular input power. Thus, when a signal corresponding to input power in the section is input to the amplifier, third-order inter-modulation distortion power of the amplifier may be greatly suppressed.

In the signal amplification apparatus with advanced linearization according to the present invention, an amplification signal in which an input signal is amplified is combined with a non-linear signal having an opposite phase to the amplification signal and a low gain and is output so that a third-order inter-modulation distortion component included in the input signal may be cancelled and a signal with advanced linearity may be output. Also, a passive element is additionally connected to the signal amplification apparatus so that the magnitude of the amplification signal and the magnitude of the non-linear signal may be adjusted to be the same and linearity of the signal may be further enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A signal amplification apparatus comprising:
   a driving unit having a structure of a cascode amplifier comprising a first active element and a second active element and outputting an amplification signal in which an input signal is amplified, to an output terminal;
   a third active element receiving a signal diverged between the first active element and the second active element while gate and drain terminals of the third active element are shorted;
   a fourth active element of which gate and drain terminals are connected to a source terminal of the third active element; and
   a fifth active element of which gate terminal is connected to the drain terminal of the fourth active element, outputting a non-linear signal having an opposite phase to the amplification signal to the output terminal so as to cancel a third-order inter-modulation distortion component included in the input signal.

2. The signal amplification apparatus of claim 1, wherein the driving unit comprises a first active element in which a magnitude of a current between drain and source terminals is varied based on a magnitude of a voltage between gate and source terminals and the input signal is input to the gate terminal, and a second active element in which a gate terminal is connected to a bias electric potential, a source terminal is connected to the drain terminal of the first active element and a drain terminal is connected to the output terminal.

3. The signal amplification apparatus of claim 2, further comprising a first resistor element that is a passive element connected between a drain terminal of the fourth active element and a gate terminal of the fifth active element and adjusting a magnitude of the non-linear signal.

4. The signal amplification apparatus of claim 2, further comprising a second resistor element that is a passive element connected between a drain terminal of the fifth active element and the output terminal and adjusting a magnitude of the non-linear signal.

5. The signal amplification apparatus of claim 3, further comprising a second resistor element that is a passive element connected between a drain terminal of the fifth active element and the output terminal and adjusting a magnitude of the non-linear signal.

\* \* \* \* \*